(12) United States Patent
Barratt (10) Patent No.: US 10,581,408 B2
(45) Date of Patent: Mar. 3, 2020

(54) DIGITAL PROCESSING OF AUDIO SIGNALS UTILIZING COSINE FUNCTIONS

(71) Applicant: Lachlan Barratt, Summer Hill (AU)

(72) Inventor: Lachlan Barratt, Summer Hill (AU)

( * ) Notice: Subject to any disclaimer, the term of this patent is extended or adjusted under 35 U.S.C. 154(b) by 269 days.

(21) Appl. No.: 15/514,468

(22) PCT Filed: Sep. 26, 2015

(86) PCT No.: PCT/AU2015/050575
§ 371 (c)(1),
(2) Date: Mar. 24, 2017

(87) PCT Pub. No.: WO2016/044895
PCT Pub. Date: Mar. 31, 2016

(65) Prior Publication Data
US 2017/0250675 A1 Aug. 31, 2017

Related U.S. Application Data

(60) Provisional application No. 62/056,349, filed on Sep. 26, 2014.

(51) Int. Cl.
*H03H 17/06* (2006.01)
*H03H 17/04* (2006.01)
(Continued)

(52) U.S. Cl.
CPC ........... *H03H 17/0621* (2013.01); *G06F 5/01* (2013.01); *G06F 17/18* (2013.01);
(Continued)

(58) Field of Classification Search
CPC ................. H03H 17/0444; H03H 17/0657
(Continued)

(56) References Cited

U.S. PATENT DOCUMENTS

| 6,772,181 B1 * | 8/2004 | Fu ........................... G06F 17/17 708/290 |
| 2011/0144934 A1 * | 6/2011 | Bilgin ................ H03H 17/0642 702/66 |

FOREIGN PATENT DOCUMENTS

| WO | 2014/153604 A1 | 10/2014 |
| WO | 2014/153605 A1 | 10/2014 |

(Continued)

OTHER PUBLICATIONS

A. Roy and J. F. Doherty, "Raised cosine interpolation for empirical mode decomposition", 43rd Annual Conference on Information Sciences and Systems (CISS), pp. 888-892, 2009 (Year: 2009).*

(Continued)

*Primary Examiner* — Matthew D Sandifer
(74) *Attorney, Agent, or Firm* — Maschoff Brennan (57) ABSTRACT

A method of increasing the sample rate of a digital signal by creating intermediate sample points between adjacent neighbouring sample points comprising the step of populating each of the intermediate sample points depending on a weighted influence of a predetermined number of the neighbouring sample points, the weighted influence being calculated by representing the digital signal or filter at the predetermined number of sample points at least in part by its cosine components, which are each represented by absolute values of a cosine function in the time domain substantially limited to half a waveform cycle at its mid-point; combining the aforementioned cosine components at each of the neighbouring sample points to obtain waveforms at each of the neighboring sample points; determining values for each of the waveforms at the intermediate sample points and combining the determined values at the intermediate sample point to derive the weighted influence.

17 Claims, 8 Drawing Sheets

(51) Int. Cl.
    *H03H 17/02*     (2006.01)
    *G06F 5/01*     (2006.01)
    *G06F 17/18*     (2006.01)
    *H04R 3/04*     (2006.01)

(52) U.S. Cl.
    CPC .... *H03H 17/0248* (2013.01); *H03H 17/0444* (2013.01); *H03H 17/0657* (2013.01); *H04R 3/04* (2013.01)

(58) Field of Classification Search
    USPC ........................................................ 708/313
    See application file for complete search history.

(56) References Cited

FOREIGN PATENT DOCUMENTS

| | | |
|---|---|---|
| WO | 2014/153606 A1 | 10/2014 |
| WO | 2014/153607 A1 | 10/2014 |
| WO | 2014/153609 A1 | 10/2014 |

OTHER PUBLICATIONS

Paul Bourke, "Interpolation Methods", Dec. 1999, retrieved from paulbourke.net/miscellaneous/interpolation/ (Year: 1999).*

First-order hold—Wikipedia <URL: https://en.wikipedia.org/w/index.php?title=First-order_hold&oldid=595155673> Published on Feb. 12, 2014 as per Wikipedia revision history, accessed Mar. 23, 2017.

Smith, J.0., "Physical Audio Signal Processing", Online Book, 2010 Edition <URL: https://ccrma.stanford.edu/Hos/pasp/pasp.html> Chapter: Delay/Signal Interpolation, Sections: Linear Interpolation, Lagrange Interpolation, Windowed Sine Interpolation, accessed Mar. 23, 2017.

Orfandis, S. J., "Introduction to Signal Processing", Rutgers University, Online Book, 2010 [Online] [Retrieved from the Internet on Jan. 4, 2016] <URL: http://eceweb Lrutgers.edu/—orfanidi/intro2sp/> Chapter: 12 "Interpolation, Decimation, and Oversampling", Specifically: Figures 12.1.1 and 12.1.11 and surrounding text, accessed Mar. 23, 2017.

* cited by examiner

DIGITAL PROCESSING OF AUDIO SIGNALS UTILIZING COSINE FUNCTIONS

TECHNICAL FIELD

The present invention relates broadly to a method of processing a digital signal or a digital filter. The invention relates particularly although not exclusively to digitally filtering an audio signal in audio equalisation (EQ). The invention extends to other signal processing including processing signals associated with images or digital communications.

BACKGROUND OF INVENTION

In digital recording and playback an analog signal representative of audio is converted into a digital signal which lends itself to manipulation and storage. The conversion is performed in an analog to digital converter (ADC). The stored digital signal can be converted back to an analog signal in a digital to analog converter (DAC). The analog signal is played back using conventional audio equipment such as amplifiers and speakers. The digital signal can be manipulated prior to the DAC to improve its quality before playback. This manipulation includes audio EQ where selected parts of the frequency spectrum of the audio are filtered to, for example, compensate for irregularities in the frequency response. The digital signal may also be filtered to resolve problems from its conversion into a digital signal or back to an analog signal.

SUMMARY OF INVENTION

According to a first aspect of the present invention there is provided a method of processing a digital signal or a digital filter, said method comprising the steps of:
increasing the sample rate of the signal or filter from a predetermined sample rate including neighbouring sample points to an increased sample rate including intermediate sample points between adjacent of the neighbouring sample points;
populating each of the intermediate sample points depending on a weighted influence of a predetermined number of the neighbouring sample points, the weighted influence being calculated for each of the intermediate sample points by:
  (i) representing the digital signal or the filter at the predetermined number of the neighbouring sample points at least in part by its cosine components, each component represented by absolute values of a cosine function in the time domain substantially limited to half a waveform cycle at its mid-point;
  (ii) combining the half-cycle cosine components at each of the neighbouring sample points to obtain representative waveforms located at respective of the neighbouring sample points;
  (iii) determining values for each of the representative waveforms at the intermediate sample point;
  (iv) combining the determined values at the intermediate sample point to derive the weighted influence.
Preferably calculation of the weighted influence also involves expansion of the representative waveforms prior to determining their values at the intermediate sample points.

According to a second aspect of the invention there is provided a method of processing a digital signal or a digital filter, said method comprising the steps of:
increasing the sample rate of the signal or the filter from a predetermined sample rate including neighbouring sample points to an increased sample rate including intermediate sample points between adjacent of the neighbouring sample points;
populating each of the intermediate sample points depending on a weighted influence of a predetermined number of the neighbouring sample points, the weighted influence being calculated for each of the intermediate sample points by:
  (i) representing the digital signal or the filter at one of the predetermined number of the neighbouring sample points at least in part by its cosine components, each component represented by absolute values of a cosine function in the time domain substantially limited to half a waveform cycle at its mid-point;
  (ii) combining the half-cycle cosine components to obtain a representative waveform at the neighbouring sample point;
  (iii) shifting the representative waveform in its time domain to align with the intermediate sample point;
  (iv) determining values for the shifted representative waveform at each of the predetermined number of the neighbouring sample points;
  (v) combining the determined values at the neighbouring sample points to derive the weighted influence.

According to a third aspect of the invention there is provided a method of processing a digital signal or a digital filter, said method comprising the steps of:
increasing the sample rate of the signal or the filter from a predetermined sample rate including neighbouring sample points to an increased sample rate including intermediate sample points between adjacent of the neighbouring sample points;
populating each of the intermediate sample points depending on a weighted influence of a predetermined number of the neighbouring sample points, the weighted influence being calculated for each of the intermediate sample points by:
  (i) representing the digital signal or the filter at one of the predetermined number of the neighbouring sample points at least in part by its cosine components, each component represented by absolute values of a cosine function in the time domain substantially limited to half a waveform cycle at its mid-point;
  (ii) combining the half-cycle cosine components to obtain a representative waveform at the neighbouring sample point;
  (iii) shifting the representative waveform in its time domain to align with the intermediate sample point;
  (iv) expanding the shifted representative waveform in the time domain;
  (v) determining values for the expanded and shifted representative waveform at the neighbouring sample points;
  (vi) combining the determined values at the neighbouring sample points to derive the weighted influence.

According to a fourth aspect of the invention there is provided a method of processing a digital signal or a digital filter, said method comprising the steps of.
increasing the sample rate of the signal or the filter from a predetermined sample rate including neighbouring sample points to an increased sample rate including intermediate sample points between adjacent of the neighbouring sample points;

populating each of the intermediate sample points depending on a weighted influence of a predetermined number of the neighbouring sample points, the weighted influence being calculated for each of the intermediate sample points by:
  (i) representing the digital signal or the filter at the predetermined number of the neighbouring sample points at least in part by its cosine components, each component represented by absolute values of a cosine function in the time domain substantially limited to half a waveform cycle at its mid-point;
  (ii) combining the half-cycle cosine components at each of the neighbouring sample points to obtain representative waveforms located at respective of the neighbouring sample points;
  (iii) shifting each of the representative waveforms in their time domain substantially midway between the respective neighbouring sample points and the intermediate sample point;
  (iv) determining values for each of the shifted representative waveforms at the intermediate sample point;
  (v) combining the determined values at the intermediate point to derive the weighted influence.

According to a fifth aspect of the invention there is provided a method of processing a digital signal or a digital filter, said method comprising the steps of:
  increasing the sample rate of the signal or the filter from a predetermined sample rate including neighbouring sample points to an increased sample rate including intermediate sample points between adjacent of the neighbouring sample points;
  populating each of the intermediate sample points depending on a weighted influence of a predetermined number of the neighbouring sample points, the weighted influence being calculated for each of the intermediate sample points by:
    (i) representing the digital signal or the filter at one of the predetermined number of the neighbouring sample points at least in part by its cosine components, each component represented by absolute values of a cosine function in the time domain substantially limited to half a waveform cycle at its mid-point;
    (ii) combining the half-cycle cosine components to obtain a representative waveform at the neighbouring sample point;
    (iii) shifting the representative waveforms in its time domain substantially midway between the neighbouring sample point and the intermediate sample point;
    (iv) determining values for the shifted representative waveform at each of the predetermined number of the neighbouring sample points;
    (v) combining the determined values at the neighbouring sample points to derive the weighted influence.

Preferably the method also comprises the step of adjusting the cosine components or the representative waveforms by applying a mathematical function to said components or waveforms. More preferably the mathematical function is applied as an averaging curve to each of the cosine components where a width of the averaging curve is adjusted proportional to the frequency of the waveform cycle.

Preferably the method further comprises the steps of:
  providing another digital filter including a mid-sample point and a plurality of neighbouring sample points either side of the mid-sample point at the predetermined sample rate;
  applying the other digital filter to either the digital signal or the digital filter where:
    (i) the mid-sample point of the other filter is applied to a corresponding one of the neighbouring sample points of either the signal or the filter;
    (ii) the neighbouring sample points of the other filter are applied to respective of the intermediate sample points, or the neighbouring sample point, of either the signal or the filter which are offset in the time domain relative to the respective neighbouring sample points of the other filter.

More preferably the step of applying the other filter to either the signal or the filter involves applying said filter at an adjusted sampling rate proportional to the offset of the sample points of the digital signal or the filter relative to respective of the neighbouring sample points of the other filter.

Alternatively the method further comprises the steps of:
  providing another digital signal including a mid-sample point and a plurality of neighbouring sample points either side of the mid-sample point at the predetermined sample rate;
  applying the other digital signal to either the signal or the filter where:
    (i) the mid-sample point of the other signal is applied to a corresponding one of the neighbouring sample points of either the signal or the filter;
    (ii) the neighbouring sample points of the other signal are applied to respective of the intermediate sample points, or the neighbouring sample point, of either the signal or the filter which are offset in the time domain relative to the respective neighbouring sample points of the other filter.

In this embodiment the step of applying the other signal to either the signal or the filter involves applying said signal at an adjusted sampling rate proportional to the offset of the sample points of the digital signal or filter relative to respective of the neighbouring sample points of the other filter.

According to a sixth aspect of the invention there is provided computer code which when executed implements the method of any one of the preceding statements.

According to a seventh aspect of the invention there is provided a computer or device-readable medium including instructions for processing a digital signal or a digital filter, said instructions when executed by a processor cause said processor to:
  increase the sample rate of the signal or filter from a predetermined sample rate to an increased sample rate including intermediate sample points between adjacent of the neighbouring sample points;
  populate each of the intermediate sample points depending on a weighted influence of a predetermined number of the neighbouring sample points, the weighted influence being calculated for each of the intermediate sample points by:
    (i) representing the digital signal or the filter at the predetermined number of the neighbouring sample points at least in part by its cosine components, each component represented by absolute values of a cosine function in the time domain substantially limited to half a waveform cycle at its mid-point;

(ii) combining the half-cycle cosine components at each of the neighbouring sample points to obtain representative waveforms located at respective of the neighbouring sample points;

(iii) determining values for each of the representative waveforms at the intermediate sample point;

(iv) combining the determined values at the intermediate sample point to derive the weighted influence.

According to an eighth aspect of the invention there is provided a computer or device-readable medium including instructions for processing a digital signal or a digital filter, said instructions when executed by a processor cause said processor to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:

(i) representing the digital signal or the filter at one of the predetermined number of the neighbouring sample points at least in part by its cosine components, each component represented by absolute values of a cosine function in the time domain substantially limited to half a waveform cycle at its mid-point;

(ii) combining the half-cycle cosine components to obtain a representative waveform at the neighbouring sample point;

(iii) shifting the representative waveform in its time domain to align with the intermediate sample point;

(iv) determining values for the shifted representative waveform at each of the predetermined number of the neighbouring sample points;

(v) combining the determined values at the neighbouring sample points to derive the weighted influence.

According to a ninth aspect of the invention there is provided a computer or device-readable medium including instructions for processing a digital signal or a digital filter, said instructions when executed by a processor cause said processor to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:

(i) representing the digital signal or the filter at one of the predetermined number of the neighbouring sample points at least in part by its cosine components, each component represented by absolute values of a cosine function in the time domain substantially limited to half a waveform cycle at its mid-point;

(ii) combining the half-cycle cosine components to obtain a representative waveform at the neighbouring sample point;

(iii) shifting the representative waveform in its time domain to align with the intermediate sample point;

(iv) expanding the shifted representative waveform in the time domain;

(v) determining values for the expanded and shifted representative waveform at the neighbouring sample points;

(vi) combining the determined values at the neighbouring sample points to derive the weighted influence.

According to a tenth aspect of the invention there is provided a computer or device-readable medium including instructions for processing a digital signal or a digital filter, said instructions when executed by a processor cause said processor to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:

(i) representing the digital signal or the filter at the predetermined number of the neighbouring sample points at least in part by its cosine components, each component represented by absolute values of a cosine function in the time domain substantially limited to half a waveform cycle at its mid-point;

(ii) combining the half-cycle cosine components at each of the neighbouring sample points to obtain representative waveforms located at respective of the neighbouring sample points;

(iii) shifting each of the representative waveforms in their time domain substantially midway between the respective neighbouring sample points and the intermediate sample point;

(iv) determining values for each of the shifted representative waveforms at the intermediate sample point;

(v) combining the determined values at the intermediate point to derive the weighted influence.

According to an eleventh aspect of the invention there is provided a computer or device-readable medium including instructions for processing a digital signal or a digital filter, said instructions when executed by a processor cause said processor to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:

(i) representing the digital signal or the filter at one of the predetermined number of the neighbouring sample points at least in part by its cosine components, each component represented by absolute values of a cosine function in the time domain substantially limited to half a waveform cycle at its mid-point;

(ii) combining the half-cycle cosine components to obtain a representative waveform at the neighbouring sample point;

(iii) shifting the representative waveforms in its time domain substantially midway between the neighbouring sample point and the intermediate sample point;

(iv) determining values for the shifted representative waveform at each of the predetermined number of the neighbouring sample points;

(v) combining the determined values at the neighbouring sample points to derive the weighted influence.

According to a twelfth aspect of the invention there is provided a computer system for processing a digital signal or a digital filter, said system comprising a processor configured to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:

(i) representing the digital signal or the filter at the predetermined number of the neighbouring sample points at least in part by its cosine components, each component represented by absolute values of a cosine function in the time domain substantially limited to half a waveform cycle at its mid-point;

(ii) combining the half-cycle cosine components at each of the neighbouring sample points to obtain representative waveforms located at respective of the neighbouring sample points;

(iii) determining values for each of the representative waveforms at the intermediate sample point;

(iv) combining the determined values at the intermediate sample point to derive the weighted influence.

According to a thirteenth aspect of the invention there is provided a computer system for processing a digital signal or a digital filter, said system comprising a processor configured to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:

(i) representing the digital signal or the filter at one of the predetermined number of the neighbouring sample points at least in part by its cosine components, each component represented by absolute values of a cosine function in the time domain substantially limited to half a waveform cycle at its mid-point;

(ii) combining the half-cycle cosine components to obtain a representative waveform at the neighbouring sample point;

(iii) shifting the representative waveform in its time domain to align with the intermediate sample point;

(iv) determining values for the shifted representative waveform at each of the predetermined number of the neighbouring sample points;

(v) combining the determined values at the neighbouring sample points to derive the weighted influence.

According to a fourteenth aspect of the invention there is provided a computer system for processing a digital signal or a digital filter, said system comprising a processor configured to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:

(i) representing the digital signal or the filter at one of the predetermined number of the neighbouring sample points at least in part by its cosine components, each component represented by absolute values of a cosine function in the time domain substantially limited to half a waveform cycle at its mid-point;

(ii) combining the half-cycle cosine components to obtain a representative waveform at the neighbouring sample point;

(iii) shifting the representative waveform in its time domain to align with the intermediate sample point;

(iv) expanding the shifted representative waveform in the time domain;

(v) determining values for the expanded and shifted representative waveform at the neighbouring sample points;

(vi) combining the determined values at the neighbouring sample points to derive the weighted influence.

According to a fifteenth aspect of the invention there is provided a computer system for processing a digital signal or a digital filter, said system comprising a processor configured to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:

(i) representing the digital signal or the filter at the predetermined number of the neighbouring sample points at least in part by its cosine components, each component represented by absolute values of a cosine function in the time domain substantially limited to half a waveform cycle at its mid-point;

(ii) combining the half-cycle cosine components at each of the neighbouring sample points to obtain representative waveforms located at respective of the neighbouring sample points;

(iii) shifting each of the representative waveforms in their time domain substantially midway between the respective neighbouring sample points and the intermediate sample point;

(iv) determining values for each of the shifted representative waveforms at the intermediate sample point;

(v) combining the determined values at the intermediate point to derive the weighted influence.

According to a sixteenth aspect of the invention there is provided a computer system for processing a digital signal or a digital filter, said system comprising a processor configured to:

increase the sample rate of the signal or filter from a predetermined sample rate to an increased sample rate including intermediate sample points between adjacent of the neighbouring sample points;

populate each of the intermediate sample points depending on a weighted influence of a predetermined number of the neighbouring sample points, the weighted influence being calculated for each of the intermediate sample points by:
  (i) representing the digital signal or the filter at one of the predetermined number of the neighbouring sample points at least in part by its cosine components, each component represented by absolute values of a cosine function in the time domain substantially limited to half a waveform cycle at its mid-point;
  (ii) combining the half-cycle cosine components to obtain a representative waveform at the neighbouring sample point;
  (iii) shifting the representative waveforms in its time domain substantially midway between the neighbouring sample point and the intermediate sample point;
  (iv) determining values for the shifted representative waveform at each of the predetermined number of the neighbouring sample points;
  (v) combining the determined values at the neighbouring sample points to derive the weighted influence.

BRIEF DESCRIPTION OF DRAWINGS

In order to achieve a better understanding of the nature of the present invention a preferred embodiment of a method of processing a digital signal or a digital filter will now be described, by way of example only, with reference to the accompanying drawings in which.

DESCRIPTION OF EMBODIMENTS

The present invention is directed to a method of digitally processing a digital signal or a digital filter. The sample rate of the signal or filter can be increased from a predetermined sample rate to an increased sample rate by at least one of the various techniques described herein. It is to be understood that these techniques are relevant to the application of increased sample rates to audio, digital images, and digital communications.

Figure 1:
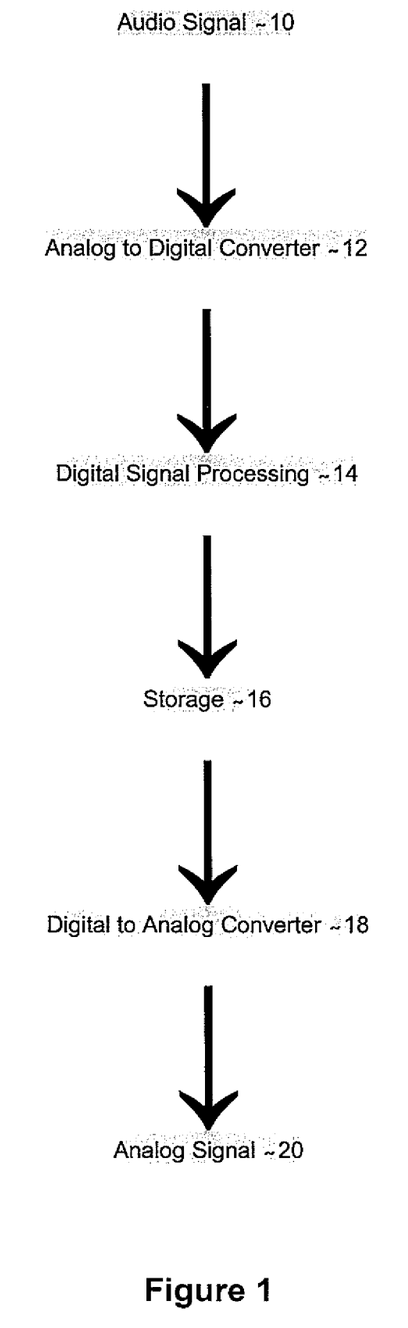
FIG. 1 is a schematic of application of embodiments of the invention in digital audio recording and playback.

FIG. 1 shows application of the various embodiments of the invention in the course of digital audio recording and playback. The analog audio signal 10 is converted to a digital audio signal at an analog to digital converter (ADC) 12. The digital audio signal may then be subject to signal processing at digital processor 14, for example in audio equalisation (EQ). The process digital signal is down-sampled and stored at storage memory 16 before a sample rate increase to increase its resolution prior to playback. The relatively high resolution digital audio signal is then converted back to an analog signal 20 at a digital to analog converter (DAC) 18.

It will be understood that the various embodiments of the invention can be applied:
1. At the ADC 12 where the digital audio signal undergoes a sample rate increase or over-sampling;
2. At the digital signal processor 14 or a digital filter associated with EQ where, for example, the digital signal is filtered with a lowpass filter or bandpass filter;
3. Downstream of the storage memory 16 where the filtered audio signal undergoes a sample rate increase or up-sampling prior to playback.

The invention in its preferred form is embodied in computer program code or software such as plugin software. The digital filter of the digital signal processor, or the digital signal, is represented by a particular frequency response. The particular frequency response is generally dependent on the impulse response of the filter which is characterised by the software or techniques of the various embodiments of this invention. The invention in its preferred embodiments is intended to cover the basic types of frequency response by which filters are classified including lowpass, highpass, bandpass and band reject or notch filters. The filters are broadly categorised as Finite Impulse Response (FIR) or Infinite Impulse Response (IIR) filters.

In order to understand this embodiment of the invention the digital signal or for example audio signal is represented by an impulse produced by an impulse fed to a sample filter. The impulse response may be constructed from cosine components represented by absolute results of a cosine function in the time domain substantially limited to half a cycle at its mid-point. The half-cycle cosine components are summed across the relevant frequency range and this is represented in the computational software program Mathematica as follows:

$$\text{If}\left[x < \frac{1}{4lpfHighest}, \int_0^{lpfHighest} \frac{\text{Cos}[2\pi \times lpf]}{\left(\int_{\frac{1}{4lpf}}^{\frac{1}{4lpf}} \text{Cos}[2\pi \times lpf]dx\right)} dlpf,\right.$$

$$\left.\int_0^{\frac{1}{4x}} \frac{\text{Cos}[2\pi \times lpf]}{\left(\left(\int_{\frac{1}{4lpf}}^{\frac{1}{4lpf}} \text{Cos}[2\pi \times lpf]dx\right)\right)} dlpf\right]$$

$$\text{curve} = \text{Re}\left[\text{If}\left[\text{Abs}(x) < .5,\right.\right.$$

$$\left.\left.\frac{-1 + \text{Cos}[\pi\text{Abs}[x]] + \pi\text{Abs}[x]\text{Sin}[\pi\text{Abs}[x]]}{4\pi x^2}, \frac{-2 + \pi}{8\pi x^2}\right]\right];$$

Where lpf is equivalent to the Nyquist frequency and x is the time variable on the x axis.

Figure 2:
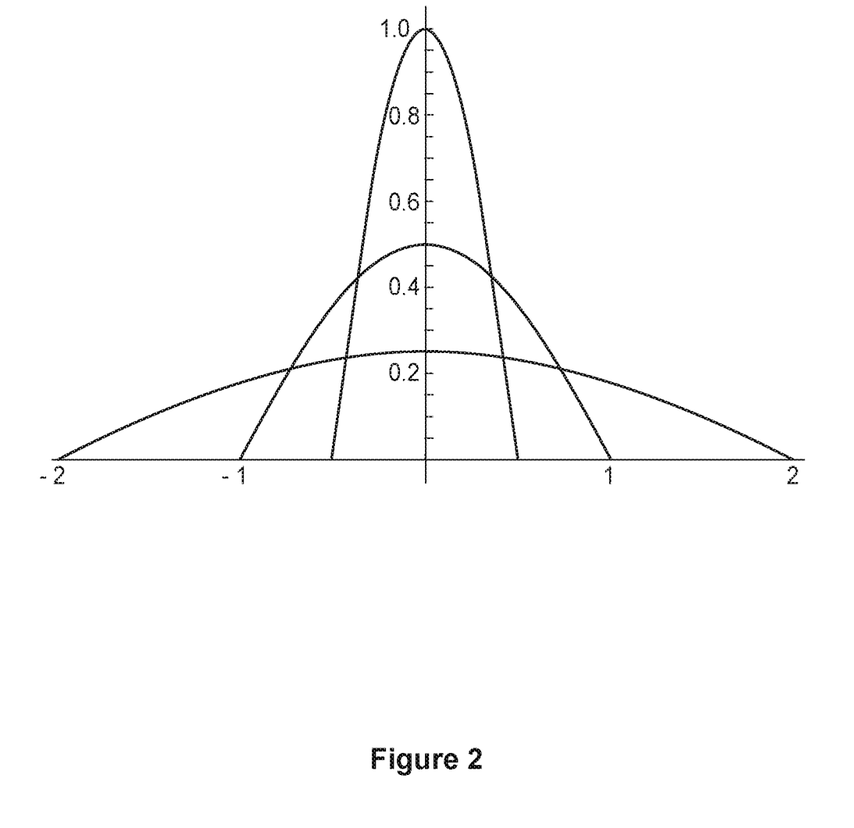
FIG. 2 is a schematic illustration of waveform components used to construct a filter in accordance with an embodiment of the invention.

The half-cycle cosine waveform components are each preferably weighted for substantially equal contribution to the impulse response. This weighting is shown in the formula above and may also be approximated as equal areas under each of the half-cycle cosine component curves. FIG. 2 shows select half-cycle cosine component waveforms having been weighted and from which the impulse response is constructed.

Figure 3:
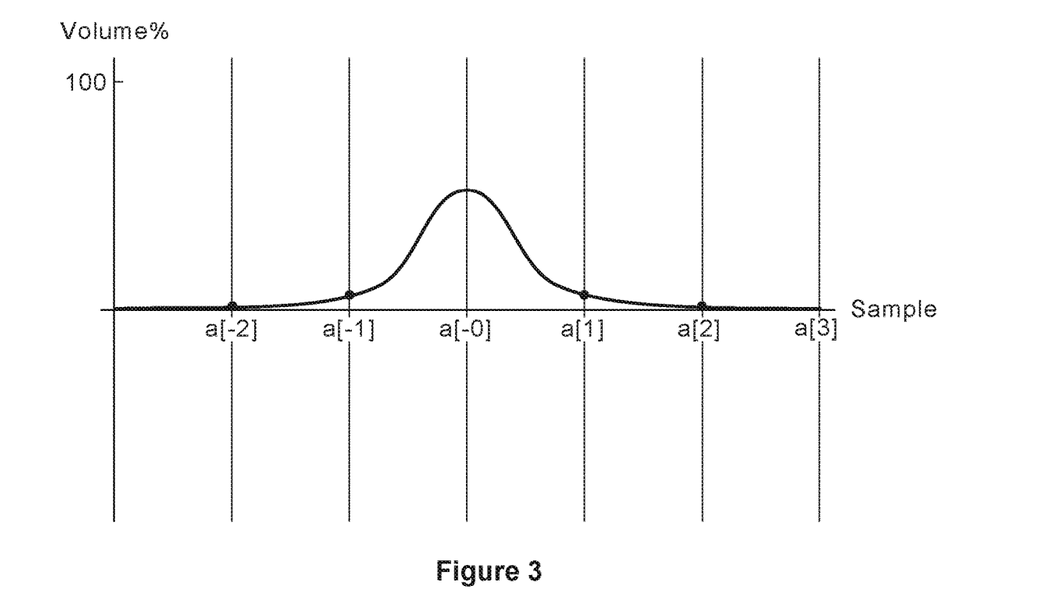
FIG. 3 is an impulse response of an audio filter derived from the component waveforms of FIG. 2.

FIG. 3 illustrates the impulse response of this equation. It is to be understood that a[0] is the instance at which the impulse occurs and a[n] designates neighbouring sample points for the impulse response where n is the number of the sample point at the predetermined sample rate. In this embodiment the predetermined sample rate is 44.1 kHz (samples per second) although it will be appreciated that any other sample rate may be used depending on the application.

Figure 4:
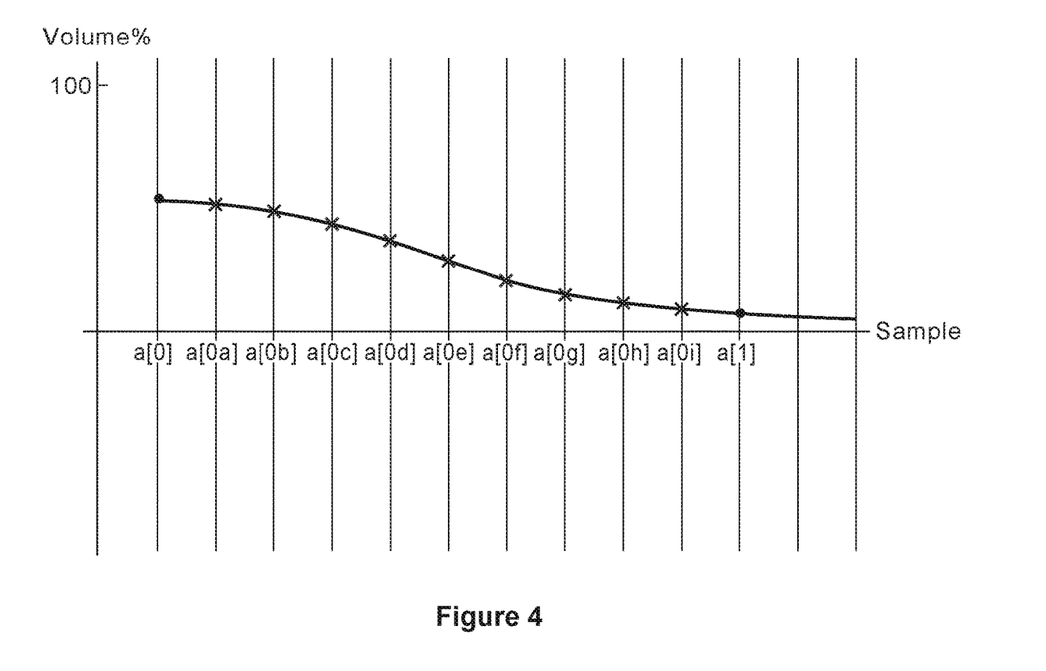
FIG. 4 is an enlarged view of the impulse response of FIG. 2 with an increased sample rate.

FIG. 4 illustrates an enlarged view of the impulse response of FIG. 3 with a sample rate increase to the increased sample rate. For illustrative purposes only the predetermined sample rate is increased by a factor of ten (10) with nine (9) intermediate and equally spaced sample points designated a [0a] to a [0i] located between neighbouring sample points such as a[0] and a[1]. In some embodiment the predetermined sample rate may in practice be increased by a factor of up to 1,000 where the increased sample rate is 44,100 kHz.

The sample rate increase is performed by populating each of the intermediate sample points depending on a weighted influence of a predetermined number of the neighbouring sample points. For example 1,024 neighbouring sample points may be taken into account with 512 sample points either side of the intermediate sample point being populated. The weighted influence may be calculated for each of the intermediate sample points by any one of the following exemplary techniques involving:

1. Representative waveforms at respective of neighbouring sample points where values are combined at the intermediate sample point;
2. A representative waveform at the intermediate sample point where values are combined at the neighbouring sample points;
3. A representative and expanded waveform at the intermediate sample point where values are combined at the neighbouring sample points;
4. Representative waveforms at respective neighbouring sample points shifted midway to the intermediate sample point with values combined at the intermediate sample point;
5. Representative waveform at the neighbouring sample point shifted mid-way to the intermediate sample point with values combined from the neighbouring sample points.

Figure 5A:
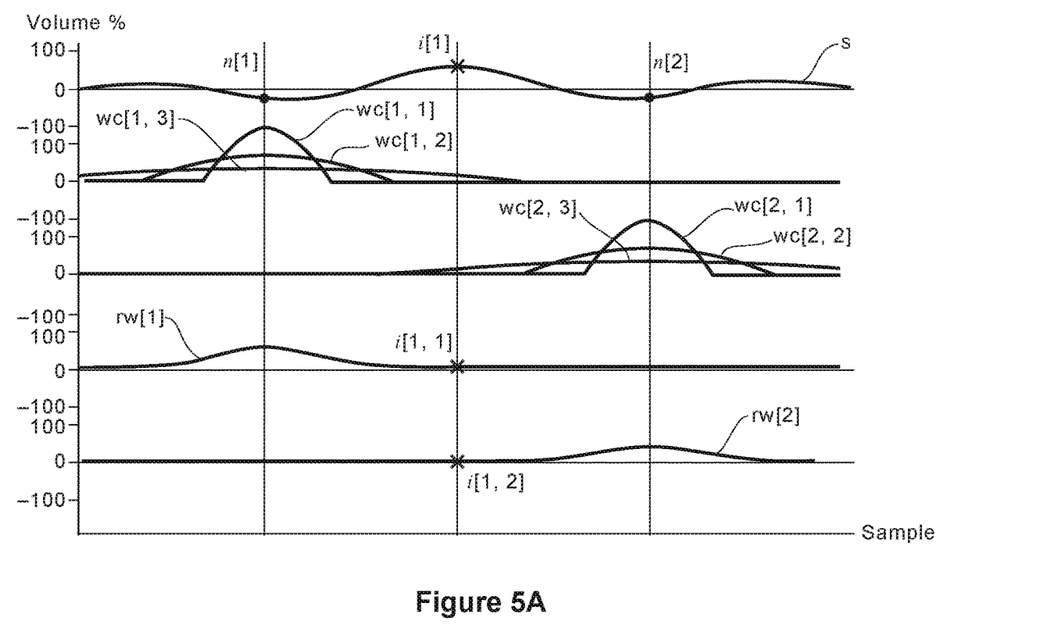
FIGS. 5A to 5E are schematics of different techniques for increasing the sample rate of the impulse response.

FIG. 5A schematically illustrates the technique utilising representative waveforms at neighbouring sample points with values combined at the intermediate sample point. In this embodiment the digital signal S or filter is represented at the predetermined number of the neighbouring sample points by its cosine components. For simplicity the signal or S is shown at two neighbouring sample points n[1] and n[2] with a single intermediate sample point i[1]. In practice the resolution of the calculation may extend to many more neighbouring sample points, for example 1,024 sample points.

The digital signal S at n[1] is for simplicity represented with three weighted waveform components designated wc[1,1] and wc[1,2]. In practice the signal S will be represented by many more waveform components sufficient to cover the frequency content of the signal. Each of the waveform components are in this embodiment represented by absolute values of a cosine function in the time domain substantially limited to half a waveform cycle at its midpoint. The waveform components such as wc[1,1], wc[1,2] and wc[1,3] are combined or in this exampled summed at the relevant neighbouring sample point n[1] to obtain a representative waveform designated rw[1]. With this technique the weighted influence is calculated by combining values for the representative waveforms such as rw[1] and rw[2] at the intermediate sample point by i[1]. The determined values at the intermediate sample point i[1] are in this example designated i[1,1] and i[1,2]. These steps are repeated for each of the intermediate sample points in order to populate the digital signal or filter at the increased sample rate.

Figure 5B:
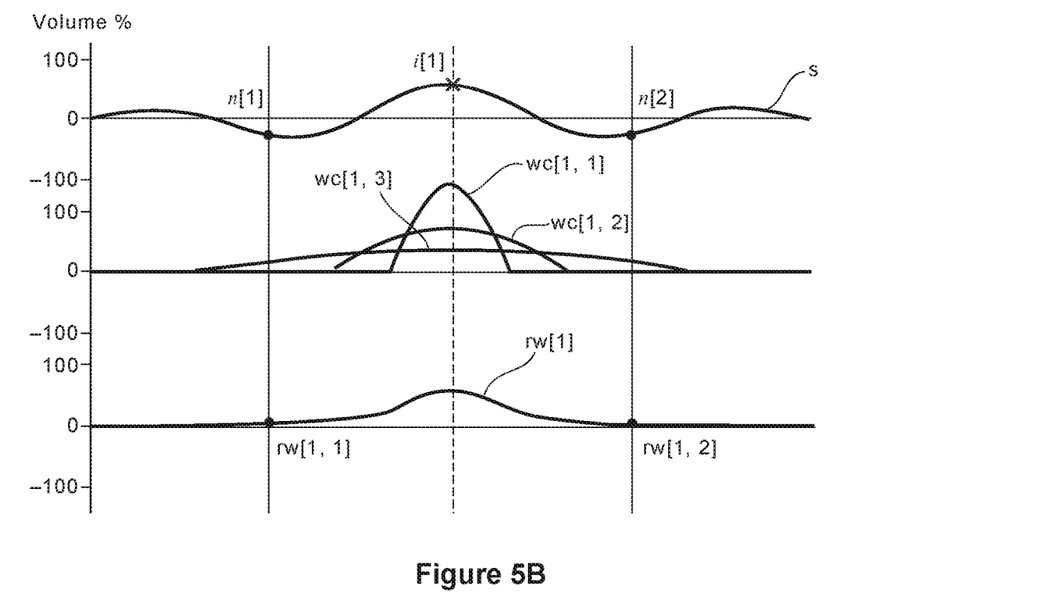

FIG. 5B schematically illustrates the technique where the representative waveform is located at the intermediate sample point and values combined from the predetermined number of neighbouring sample points. For ease of reference the same nomenclature has been adopted in designating the various waveforms and sample points. In this embodiment the values to be combined from the neighbouring sample points such as n[1] and n[2] have been designated as rw[1,1] and rw[1,2] for the representative waveform rw[1].

Figure 5C:
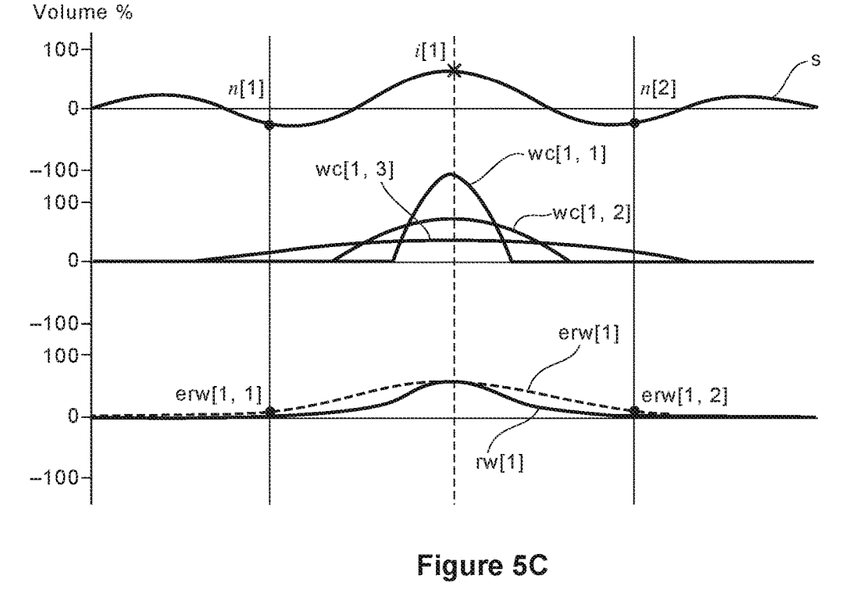

FIG. 5C schematically illustrates the representative and expanded waveform located at the intermediate sample point with values combined from the neighbouring sample points. In this example the representative waveform rw[1] is shifted to align with the intermediate sample point i[1] and expanded in the time domain or x-axis by a factor of two. The expanded representative waveform is shown in broken line detail and designated as erw[1]. Alternatively the waveform components may be expanded in the time domain before they are combined to provide the representative waveform. The determined values for the expanded representative waveform erw[1] at each of the neighbouring sample points n[1] and n[2] are designated as erw[1,1] and erw[1,2] respectively.

Figure 5D:
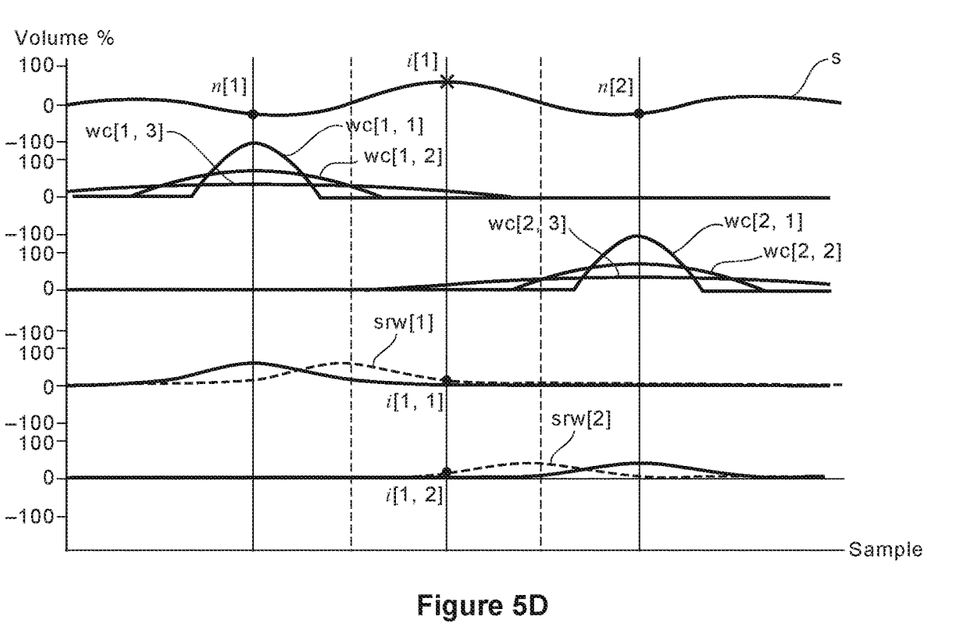

FIG. 5D schematically illustrates representative waveforms at respectively neighbouring sample points but shifted midway toward the intermediate sample point under consideration. In this variation, values are combined for each of the shifted representative waveforms at the intermediate sample point. The shifted representative waveform for each of the neighbouring sample points n[1] and n[2] is shown in hidden line detail and designated as srw[1] and srw[2] respectively. The values are determined at the intermediate sample point i[1] for each of the waveforms srw[1] and srw[2] and these values designated as i[1,1] and 1[1,2] respectively.

Figure 5E:
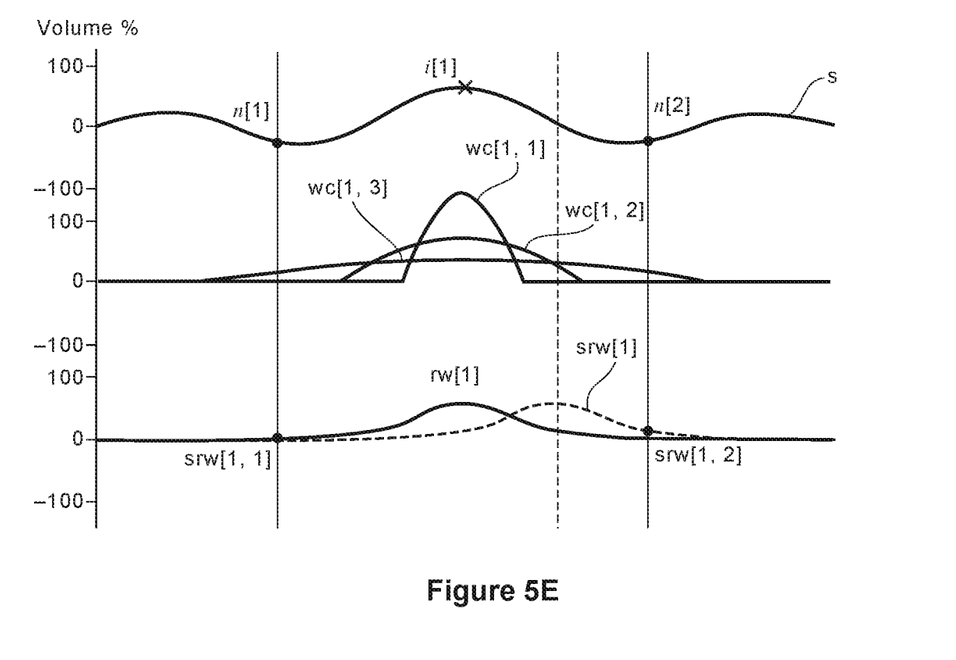

FIG. 5E schematically illustrates the technique where the representative waveform is shifted midway toward the intermediate sample point and the values combined from the neighbouring sample points. The shifted representative waveform is shown in hidden line detail and designated as srw[1]. The values to be combined for the shifted representative waveform srw[1] at the respective neighbouring sample points [1] and [2] are designated as srw[1,1] and srw[1,2].

The techniques described for calculating the weighted influence of the neighbouring sample points in populating the intermediate sample points may involve additional steps to those described in the preceding paragraphs. For example, the technique of FIG. 5A may be varied by expanding the representative waveforms such as rw[1] and rw[2] prior to determining their respective values at the intermediate sample point i[1]. The cosine components for the representative waveforms may also be adjusted by for example applying a mathematical function to each of the components or the waveforms themselves. In one embodiment the mathematical function may be applied as an averaging curve to each of the cosine components where the width of the averaging curve is adjusted proportional to the frequency of the waveform cycle. This variation is discussed in the applicant's co-pending international patent application no.

PCT/AU2014/000321 the disclosures of which are to be considered included herein by way of this reference.

Figure 6:
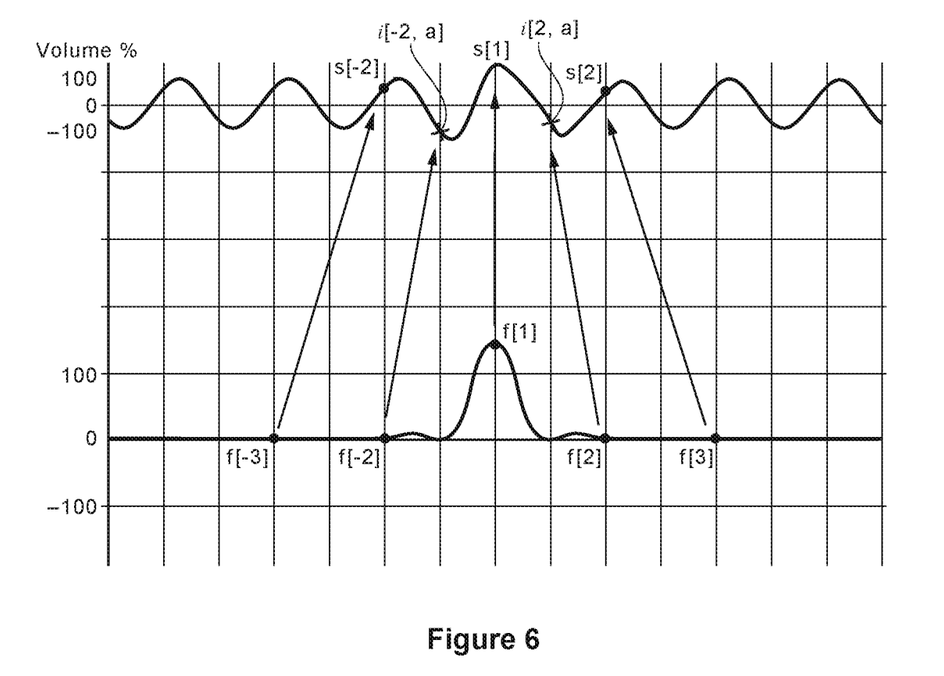
FIG. 6 is a schematic illustration of modified convolution of a digital filter with a digital signal or impulse response according to an embodiment of the invention.

FIG. 6 is a schematic illustration of application of a filter to a signal having undergone a sample rate increase adopting one of the earlier techniques. For simplicity the filter is represented by summed half-cycle cosine components described earlier. The signal has also for simplicity been illustrated with a single intermediate sample point between neighbouring sample points. In this embodiment the sample rate or resolution of the signal is the same as the filter or its component waveforms. The filter is applied to the signal in the following manner:

1. The mid-point sample of the filter f[1] is applied to a corresponding sample point of the signal s[1];
2. The neighbouring sample points of the filter such as f[2] and f[−2] are applied to respective of the intermediate sample points of the signal i[2a] and i[−2a].

The intermediate sample points of the signal are offset relative to respective neighbouring sample points of the filter or vice versa. The degree of offset may depend on the extent of the sample increase or the number of intermediate sample points populated between adjacent of the neighbouring sample points.

The filter is applied to the signal at an adjusted sampling rate to compensate for the offset of the sample points. In this example the adjusted sampling rate is inversely proportional to the offset wherein the filter is convolved with the signal at substantially twice its normal or predetermined sample rate. The filter is applied to the signal as a dot product.

Figure 7:
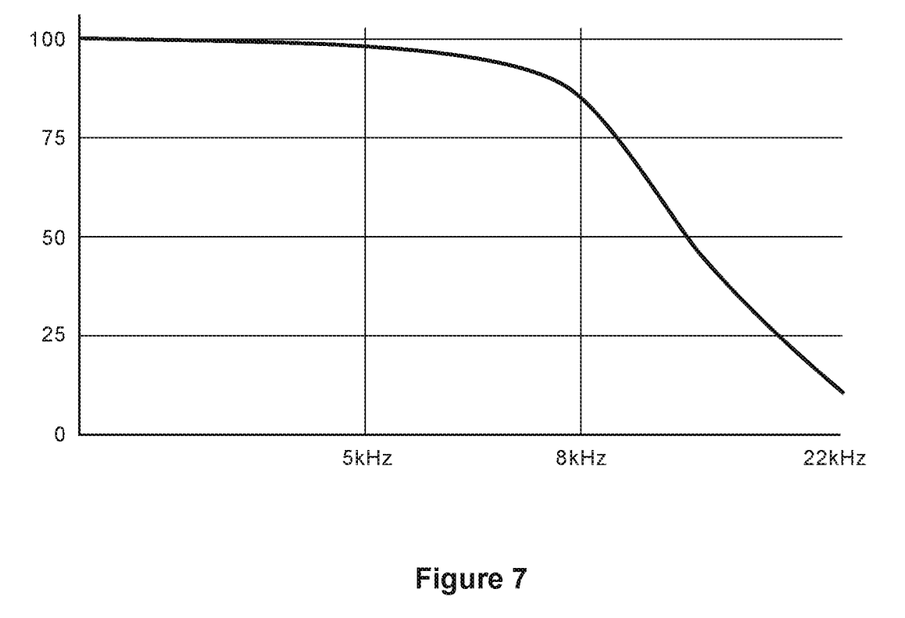
FIG. 7 is a frequency response for a lowpass filter of an embodiment of the invention.

FIG. 7 shows a frequency response curve on a logarithmic x-scale indicative of a lowpass filter at or approaching Nyquist frequency. This frequency response is obtained with the benefit of a weighted sample rate increase as described in the earlier embodiments.

It is to be understood that the methods and techniques described can be implemented as computer-readable instructions stored on a computer-readable medium. The computer-readable instructions can be executed by a processor of practically any computing system including desktop, portable, tablet, hand-held and/or any other computer device.

It is also to be understood that the present invention extends to computer-readable media for carrying or having computer-executable instructions stored thereon. The computer-readable media include RAM, ROM, EEPORM, CD-ROM or other optical disc storage, magnetic disc storages, or any other medium which carries or stores program code means in the form of computer-executable instructions. In the event of information being transferred or provided over a network or another communications connection to a computer, the computer is to be understood as viewing the connection (hardwired, wireless, or a combination thereof) as a computer-readable medium.

The contents of the applicant's following co-pending patent applications are to be taken as incorporated herein by these references:

1. PCT/AU2014/000325 titled "Audio Filtering with Virtual Sample Rate Increases";
2. PCT/AU2014/000318 titled "Audio Sample Rate Increases";
3. PCT/AU2014/000319 titled "Audio Filtering with Virtual Sample Rate Increases";
4. U.S. provisional patent application No. 61/974,326 titled "Improved Audio Processing".

Now that several preferred embodiments of the invention have been described it will be apparent to those skilled in the art that the method of processing a digital signal or a digital filter have at least the following advantages:

1. The preferred techniques adopted in increasing the sample rate account for the weighted influence of neighbouring sample points;
2. The techniques for sample rate increase lend themselves to improved filtering in for example EQ;
3. It provides a frequency response which is smoother and in this respect more akin to an analog filter.

Those skilled in the art will appreciate that the invention described herein is susceptible to variations and modifications other than those specifically described. For example, filtering may be applied or convolved as a dot product at regular sampling rates without adjustment. It is also possible that filtering can be applied in the frequency domain rather than the time domain. For example filtering in the frequency domain can involve application of fast fourier transform (FFT) algorithms. The digital signal or the filter may at least in part be represented by its sine components rather than its cosine components. In this variation the sine components are each similarly represented by a sine function in the time domain substantially limited to half a waveform cycle.

The processing of audio signals need not be limited to acoustics but extends to other sound applications including ultrasound and sonar. The invention also extends beyond audio signals to other signals including signals derived from a physical displacement such as that obtained from measurement devices, for example a strain gauge or other transducer which generally converts displacement into an electronic signal. The invention also covers samples and signals associated with digital communications.

The invention in another embodiment is applicable to imaging. For example, each of the pixels in a matrix of pixels in the image is processed with a sample rate increase. In increasing the sample rate to include intermediate points, these intermediate points are weighted depending on the influence of the neighbouring sample points or pixels. In this context the invention extends to both still image images as well as digital video. In video the techniques described are equally applicable where the video can be considered multiple frames or samples of still images.

All such variations and modifications are to be considered within the scope of the present invention the nature of which is to be determined from the foregoing description.

The claims defining the invention are as follows:

1. A method of processing a digital signal, said method comprising the steps of:
   providing a digital filter represented by an impulse response of waveform components each being absolute values of a cosine function in the time domain limited to half a waveform cycle at its midpoint, said waveform components being summed across a relevant frequency range to produce the impulse response;
   increasing the sample rate of the digital filter represented by the impulse response from a predetermined sample rate including neighbouring sample points of the impulse response to an increased sample rate including intermediate sample points of the impulse response between adjacent sample points of the neighbouring sample points;
   applying the digital filter represented by the impulse response to the digital signal;
   generating an analog signal representative of the filtered digital signal; and
   playing back the analog signal.

2. A method as defined in claim 1 also comprising the step of adjusting cosine components or representative waveforms by applying a mathematical function to said components or waveforms.

3. A method as defined in claim 2 wherein the mathematical function is applied as an averaging curve to each of the cosine components where a width of the averaging curve is adjusted proportional to the frequency of the waveform cycle.

4. A method as defined in claim 1 further comprising the steps of:
   providing another digital filter including a mid-sample point and a plurality of neighbouring sample points either side of the mid-sample point at the predetermined sample rate; and
   applying the other digital filter to the digital signal wherein:
   (i) the mid-sample point of the other digital filter is applied to a corresponding one of neighbouring sample points of the digital signal; and
   (ii) the neighbouring sample points of the other digital filter are applied to respective sample points of the intermediate sample points or the neighbouring sample point, of the digital signal, which are offset in the time domain relative to the respective neighbouring sample points of the digital filter.

5. A method as defined in claim 4 wherein the step of applying the other digital filter to the digital signal involves applying said other digital filter at an adjusted sampling rate proportional to the offset in the time domain of the sample points of the digital filter relative to respective of the neighbouring sample points of the other digital filter.

6. A method as defined in claim 1 wherein each of the intermediate sample points for the impulse response of the digital filter is calculated based on a weighted influence of a predetermined number of the neighbouring sample points of the impulse response, said weighted being calculated by:
   (i) combining half-cycle cosine components at each of the neighbouring sample points to obtain representative waveforms located at respective sample points of the neighbouring sample points;
   (ii) determining values for each of the representative waveforms at the intermediate sample point; and
   (iii) combining the determined values at the intermediate sample point to derive the weighted influence.

7. A method as defined in claim 1 wherein each of the intermediate sample points for the impulse response of the digital filter is calculated based on a weighted influence of a predetermined number of the neighbouring sample points of the impulse response, said weighted influence being calculated by:
   (i) combining half-cycle cosine components to obtain a representative waveform at the neighbouring sample point;
   (ii) shifting the representative waveform in its time domain to align with the intermediate sample point;
   (iii) determining values for the shifted representative waveform at each of the predetermined number of the neighbouring sample points; and
   (iv) combining the determined values at the neighbouring sample points to derive the weighted influence.

8. A method as defined in claim 1 wherein each of the intermediate sample points for the impulse response of the digital filter is calculated based on a weighted influence of a predetermined number of the neighbouring sample points of the impulse response, said weighted influence being calculated by:
   (i) combining half-cycle cosine components to obtain a representative waveform at the neighbouring sample point;
   (ii) shifting the representative waveform in its time domain to align with the intermediate sample point;
   (iii) expanding the shifted representative waveform in the time domain;
   (iv) determining values for the expanded and shifted representative waveform at the neighbouring sample points; and
   (v) combining the determined values at the neighbouring sample points to derive the weighted influence.

9. A method as defined in claim 1 wherein each of the intermediate sample points for the impulse response of the digital filter is calculated based on a weighted influence of a predetermined number of the neighbouring sample points of the impulse response, said weighted influence being calculated by:
   (i) combining half-cycle cosine components at each of the neighbouring sample points to obtain representative waveforms located at respective sample points of the neighbouring sample points;
   (ii) shifting each of the representative waveforms in their time domain substantially midway between the respective neighbouring sample points and the intermediate sample point;
   (iii) determining values for each of the shifted representative waveforms at the intermediate sample point; and
   (iv) combining the determined values at the intermediate point to derive the weighted influence.

10. A method as defined in claim 1 wherein each of the intermediate sample points for the impulse response of the digital filter is calculated based on a weighted influence of a predetermined number of the neighbouring sample points of the impulse response, said weighted influence being calculated by:
    (i) combining half-cycle cosine components to obtain a representative waveform at the neighbouring sample point;
    (ii) shifting the representative waveforms in its time domain substantially midway between the neighbouring sample point and the intermediate sample point;
    (iii) determining values for the shifted representative waveform at each of the predetermined number of the neighbouring sample points; and
    (iv) combining the determined values at the neighbouring sample points to derive the weighted influence.

11. A non-transitory computer or device-readable medium including instructions for processing a digital signal, said instructions when executed by a processor cause said processor to:
    provide a digital filter represented by an impulse response of waveform components each being absolute values of a cosine function in the time domain limited to half a waveform cycle at its midpoint, said waveform components being summed across a relevant frequency range to produce the impulse response;
    increase the sample rate of the digital filter represented by the impulse response from a predetermined sample rate to an increased sample rate including intermediate sample points of the impulse response between adjacent sample points of the neighbouring sample points; and
    apply the digital filter represented by the impulse response to the digital signal;
    generate an analog signal representative of the filtered digital signal; and
    play back the analog signal.

12. A non-transitory computer or device-readable medium as defined in claim 11 wherein each of the intermediate sample points for the impulse response of the digital filter is calculated based on a weighted influence of a predetermined number of the neighbouring sample points of the impulse response, said weighted influence being calculated by:
  (i) combining half-cycle cosine components at each of the neighbouring sample points to obtain representative waveforms located at respective sample points of the neighbouring sample points;
  (ii) determining values for each of the representative waveforms at the intermediate sample point; and
  (iii) combining the determined values at the intermediate sample point to derive the weighted influence.

13. A non-transitory computer or device-readable medium as defined in claim 11 wherein each of the intermediate sample points for the impulse response of the digital filter is calculated based on a weighted influence of a predetermined number of the neighbouring sample points of the impulse response, said weighted influence being calculated by:
  (i) combining half-cycle cosine components to obtain a representative waveform at the neighbouring sample point;
  (ii) shifting the representative waveform in its time domain to align with the intermediate sample point;
  (iii) determining values for the shifted representative waveform at each of the predetermined number of the neighbouring sample points; and
  (iv) combining the determined values at the neighbouring sample points to derive the weighted influence.

14. A non-transitory computer or device-readable medium as defined in claim 11 wherein each of the intermediate sample points for the impulse response of the digital filter is calculated based on a weighted influence of a predetermined number of the neighbouring sample points of the impulse response, said weighted influence being calculated by:
  (i) combining half-cycle cosine components to obtain a representative waveform at the neighbouring sample point;
  (ii) shifting the representative waveform in its time domain to align with the intermediate sample point;
  (iii) expanding the shifted representative waveform in the time domain;
  (iv) determining values for the expanded and shifted representative waveform at the neighbouring sample points; and
  (v) combining the determined values at the neighbouring sample points to derive the weighted influence.

15. A non-transitory computer or device-readable medium as defined in claim 11 wherein each of the intermediate sample points for the impulse response of the digital filter is calculated based on a weighted influence of a predetermined number of the neighbouring sample points of the impulse response, said weighted influence being calculated by:
  (i) combining half-cycle cosine components at each of the neighbouring sample points to obtain representative waveforms located at respective sample points of the neighbouring sample points;
  (ii) shifting each of the representative waveforms in their time domain substantially midway between the respective neighbouring sample points and the intermediate sample point;
  (iii) determining values for each of the shifted representative waveforms at the intermediate sample point; and
  (iv) combining the determined values at the intermediate point to derive the weighted influence.

16. A non-transitory computer or device-readable medium as defined in claim 11 wherein each of the intermediate sample points for the impulse response of the digital filter is calculated based on a weighted influence of a predetermined number of the neighbouring sample points of the impulse response, said weighted influence being calculated by:
  (i) combining half-cycle cosine components to obtain a representative waveform at the neighbouring sample point;
  (ii) shifting the representative waveforms in its time domain substantially midway between the neighbouring sample point and the intermediate sample point;
  (iii) determining values for the shifted representative waveform at each of the predetermined number of the neighbouring sample points; and
  (iv) combining the determined values at the neighbouring sample points to derive the weighted influence.

17. A computer system for processing a digital signal, said system comprising a processor configured to:
  provide a digital filter represented by an impulse response of waveform components each being absolute values of a cosine function in the time domain limited to half a waveform cycle at its midpoint, said waveform components being summed across a relevant frequency range to produce the impulse response;
  increase the sample rate of the digital filter from a predetermined sample rate to an increased sample rate including intermediate sample points of the impulse response between adjacent sample points of the neighbouring sample points; and
  apply the digital filter represented by the impulse response to the digital signal;
  generate an analog signal representative of the filtered digital signal; and
  play back the analog signal.

* * * * *